United States Patent [19]

Okudaira et al.

[11] Patent Number: 4,844,767
[45] Date of Patent: Jul. 4, 1989

[54] METHOD OF AND APPARATUS FOR ETCHING

[75] Inventors: Sadayuki Okudaira, Ome; Shigeru Nishimatsi, Kokubunji; Keizo Suzuki, Kodaira; Ken Ninomiya, Hachioji, all of Japan

[73] Assignee: Hitachi, Ltd., Tokyo, Japan

[21] Appl. No.: 158,126

[22] Filed: Feb. 16, 1988

Related U.S. Application Data

[63] Continuation of Ser. No. 881,958, Jul. 3, 1986, abandoned.

[30] Foreign Application Priority Data

Jul. 12, 1985 [JP] Japan .................................. 60-152159

[51] Int. Cl.$^4$ .............................................. B44C 1/22
[52] U.S. Cl. .................................... 156/345; 156/626; 156/627; 156/643; 204/192.13; 204/192.34; 204/192.33; 204/298; 427/38; 427/39
[58] Field of Search ............... 156/627, 643, 646, 657, 156/626, 345; 427/53.1, 39, 38; 204/192.13, 298, 192.34, 192.33

[56] References Cited

U.S. PATENT DOCUMENTS

| 4,282,267 | 8/1981 | Küyel | 204/298 X |
| 4,298,419 | 11/1981 | Suzuki et al. | 204/298 X |
| 4,609,426 | 9/1986 | Ogawa et al. | 156/345 X |
| 4,622,094 | 11/1986 | Otsubo | 156/627 |
| 4,705,595 | 11/1987 | Okudaira et al. | 156/345 X |

Primary Examiner—David L. Lacey
Assistant Examiner—Thi Dang
Attorney, Agent, or Firm—Antonelli, Terry & Wands

[57] ABSTRACT

A plasma which is formed by the contact between a microwave and a reaction gas is brought into contact with an article to be etched which is AC-biased, thereby effecting etching of an exposed region of the article. The etching is carried out in a state wherein the self-bias formed between the plasma and the article is minimized, whereby it is possible to effect etching which provides high selectivity and which enables a substantially vertical side wall to be formed.

13 Claims, 1 Drawing Sheet

METHOD OF AND APPARATUS FOR ETCHING

This application is a continuation of application Ser. No. 881,958, filed July 3, 1986, now abandoned.

BACKGROUND OF THE INVENTION

The present invention relates to an etching method and an etching apparatus employed when practicing this etching method.

To accurately form fine electrodes and wirings in various devices such as semiconductor devices and magnetic bubble memory devices, so-called dry etching is often employed in which an article to be etched and a reaction gas are brought into contact with each other to etch the article.

Among various dry etching methods, one type of dry etching method is most widely adopted which employs parallel plate type etching equipment in which two parallel metallic electrodes are disposed in opposing relation to each other, and an article to be etched is placed on one of these electrodes to effect etching.

This type of dry etching method is known as "reactive sputter etching" or "reactive ion etching" and has the advantage that it is possible to suppress the occurrence of defects known as "side etch" (or "undercut"), that is, a portion of the article which is under the mask is undesirably etched, and that etching can be effected with a high degree of accuracy.

However, as the packing density of devices such as semiconductor devices and magnetic bubble memory devices further increases and the dimensions of electrodes and wirings further decreases, there is a demand for a dry etching technique which enables these extremely fine electrodes and wirings to be formed with a high degree of accuracy.

For this reason, microwave plasma etching has already been proposed wherein a plasma is generated using a microwave to effect etching (see, Japanese Patent Publication No. 37311/1981).

As compared with the above-described reactive ion etching which employs parallel plate type etching equipment, the microwave plasma etching enables electric discharge to occur even at a relatively low pressure ($1 \times 10^{-3}$ Torr or less) and therefore has a large number of advantages. For example, it is possible to generate a high-density plasma in which ions are arranged in one direction, and to effect highly accurate etching with less defects, such as side etch. However, the microwave plasma etching still needs a number of improvements to be made in order to practically apply it widely in the manufacture of semiconductor devices and the like.

More specifically, when a polycide film (a two-layer film consisting of a silicide film of a metal such as tungsten and molybdenum and a polycrystalline silicon film), which is employed to form a gate electrode or wiring of a semiconductor device having a high packing density, is etched into a desired configuration, it is required that the dimensional shift from the mask dimensions should not be large, and the etch rate of the oxide film formed under the polycide film should not be large. However, no etching technique which can satisfy the above-described requirements has been found in the conventional reactive ion etching method.

Further, in the conventional microwave plasma etching method, when the etching selectivity ratio is increased, it is not possible to effect vertical etching (etching in which side etch is reduced, and the side wall is substantially vertical), whereas, when it is intended to perform vertical etching, the selectivity ratio must be decreased. More specifically, in any of the above-described reactive sputter etching, reactive ion etching and microwave plasma etching, although the selectivity ratio is relatively high in a gas plasma of a compound containing fluorine, vertical etching is almost impossible, and in a gas plasma of a compound containing chlorine or a gas plasma of a mixed gas formed by adding $H_2$ or $NH_3$ into a gas of a compound containing fluorine, the selectivity ratio cannot be increased although vertical etching can be effected. For example, in the conventional bias application type microwave plasma etching, since a bias voltage is applied to an article to be etched at all times, the ion energy is relatively high, and the etch rate of the oxide film which constitutes the foundation is therefore relatively large, so that it is difficult to leave the underlying oxide film unetched which is exposed by the etching of the polycide film. In addition, it is often that a thin film (side wall film) cannot be formed on the side wall formed by etching although it depends on the kind of employed gas. Since it is necessary in order to effect vertical etching to prevent side etching by means of the above-described side wall film, if the side wall film is not formed on the side wall, it becomes impossible to effect vertical etching.

SUMMARY OF THE INVENTION

It is a primary object of the present invention to solve the above-described problems of the prior art etching methods and provide an etching method which enables formation of a pattern having a substantially vertical side wall with a high selectivity over the underlying layer together with an etching apparatus which may be employed to practice this etching method.

To this end, according to the present invention, when an AC bias is applied to an article to be etched to effect microwave plasma etching, the self-bias generated between the plasma and the article is controlled so as to be minimized, thereby preventing lowering of the etching selectivity and the occurrence of side etch.

DETAILED DESCRIPTION OF THE PREFERRED EMBODIMENTS

Figure 1:
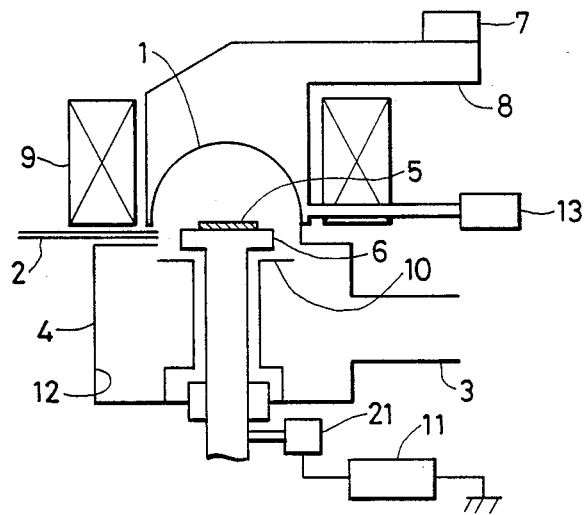
FIG. 1 shows the arrangement of the etching apparatus according to the present invention.

FIG. 1 is a view used to describe the arrangement of the microwave plasma etching device according to the present invention.

Referring to FIG. 1, a vacuum chamber 4 has a microwave inlet 1, together with a discharge gas inlet port 2 and an exhaust port 3. A table 6 for holding an article 5 to be etched thereon is provided inside the vacuum chamber 4. A microwave is introduced into the microwave inlet 1 from a microwave generator 7 through a waveguide 8. In this embodiment, an electromagnetic coil 9 is installed around the waveguide 8 and outside the microwave inlet 1. In addition, an electrically fixed electrode 10 made of an electrically conductive material is provided along the outer periphery of the shaft of the table 6 inside the vacuum chamber 4 so as to shield the same, the upper portion of the electrode 10 extending outwardly along the table 6. The shaft of the table 6 is connected to an RF power supply 11 through a matching circuit 21.

The vacuum chamber 4 is evacuated, and a gas which conforms to a particular etching process is introduced into the vacuum chamber 4 from the gas inlet port 2. The microwave generated by the microwave generator 7 is introduced into the vacuum chamber 4 through the waveguide 8 and the microwave inlet 1, to generate a plasma by electric discharge, thereby exciting the gas within the vacuum chamber 4. The electromagnetic coil 9 is employed to apply a magnetic field inside the vacuum chamber 4 in order to improve the plasma generation degree, and also to transport the plasma efficiently. When a magnetic field is applied, it is also possible to generate an electron cyclotron resonance (ECR) condition inside the vacuum chamber 4 by the cooperation of the microwave field and the magnetic field. In particular, the application of a magnetic field is an effective means for enabling discharge excitation under a relatively low gas pressure (e.g., a gas pressure lower than $10^{-3}$ Torr). Theoretically, however, a microwave plasma etching apparatus having no electromagnetic coil 9 suffices. The article 5 to be etched is in electrical contact with the table 6 made of an electrically conductive material and disposed in the plasma, but the table 6 is electrically insulated from the inner walls of the vacuum chamber 4 and the exhaust system. When a high-frequency potential is applied to the table 6 from the RF power supply 11 via the matching circuit 21, a high-frequency voltage is generated on the surface of the article 5. Since the microwave discharge is theoretically a non-polar discharge, unlike reactive ion etching and the like, no electrode for generating a plasma is disposed inside the vacuum chamber 4.

Therefore, when a high-frequency potential is applied to only the table 6, nothing but a self-bias (the floating potential alone in this case: about 20 V) is generated between the table 6 and the plasma.

For this reason, to produce a large potential difference between the article 5 and the plasma in order to increase the etch rate, it is insufficient to simply apply a high-frequency potential to the table 6 alone, and it is necessary to maintain the potential of the plasma at a constant value.

In this embodiment, the electrically fixed electrode 10 is, as shown in FIG. 1, provided inside the vacuum chamber 4 to maintain the plasma potential at a constant value. It should be noted that, in this embodiment, the fixed potential of the electrically fixed electrode 10 is set so as to be the ground potential. Further, when the plasma diffuses below the table 6, a metallic inner wall 12 of the apparatus which constitutes the exhaust system also serves as a grounding electrode. The conditions in which etching progresses inside the vacuum chamber 4 can be observed using a known etching monitor 13.

It is known that, in plasma etching, active ions and active neutral particles (hereinafter referred to as "radicals") in the plasma contribute to the progress of etching. However, when the surface of the article to be etched is covered with an oxide film, etching reaction progresses at exceedingly slow speeds if radicals alone contribute to etching. It is therefore necessary that ions having energy which is higher than a certain level should contribute to the etching process. When silicon (Si), polycrystalline silicon (Poly-Si), molybdenum (Mo), tantalum (Ta), titanium (Ti) or a silicon compound (silicide) of these elements is etched using a chlorine containing (Cl containing) gas as an etching gas, the presence of ions having energy which is higher than a certain level is also needed. However, when an article to be etched is tungsten (W) or tungsten silicide, such article is not etched easily even if a Cl containing gas which has relatively high energy is employed, since the vapor pressure of the compound of W and Cl is relatively low. On the other hand, when a fluorine containing (F containing) gas is employed, even if the ion energy is relatively low, etching can be effected without hindrance, and it is possible to obtain a high etch rate using radicals alone.

Accordingly, in etching using a Cl containing gas, to increase the energy of ions made incident on the surface of an article to be etched is effective in etching Si, Poly-Si, Mo, Ta, Ti or a silicide of these elements. When W or W silicide is etched using a mixed gas of a F containing gas and a Cl containing gas (e.g., $SF_6$ and $CCl_4$, $C_2ClF_5$, $C_2Cl_2F_4$, $C_2Cl_3F_3$, $C_2Cl_4F_2$ or $C_2Cl_5F$), it is also effective practice to increase the ion energy. The high-frequency potential applied to the article 5 to be etched in order to increase the ion energy includes not only the high-frequency potential (peak potential $V_{PP}$) applied thereto from the RF power supply 11 in order to increase the ion energy but also an average potential difference (self-bias: $V_{DC}$) newly generated between the plasma and the article 5 by the high-frequency potential applied by the RF power supply 11. In other words, $V_{DC}$ means an average accelerating voltage for ions made incident on the surface of the article 5.

On the other hand, the effect of $V_{PP}$ on ions as an accelerating voltage periodically changes due to the frequency of RF potential and $V_{DC}$. This will be explained below with reference to FIG. 2.

Figure 2:
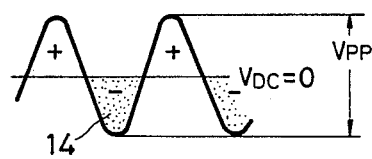
FIGS. 2 and 3 are graphs respectively showing waveforms of the high-frequency bias potentials in the case where the self-bias is zero and in the case where it is not zero.

FIG. 2 shows the waveform of the high-frequency potential of the table 6 in the case where $V_{DC}$ is 0 V for the purpose of simplifying the description. In this case, ions are accelerated only during the period of time 14 when the potential of the table 6 is negative, and the maximum accelerating voltage during that period is $\frac{1}{2}$ $V_{PP}$. If the frequency is excessively high, before ions in the plasma pass through the ion sheath to reach the surface of the article 5, a reverse bias may be applied to cause the ions to move in the reverse direction, so that it is impossible for the ions to reach the surface of the article 5. It is therefore preferable to avoid excessively increasing the frequency of the high-frequency potential applied to the article 5. For example, in the case where the ion sheath width is about 0.1 mm, if the frequency is set at about 10 MHz or less, $F^+$ ions can be made incident on the surface of the article 5 in response to the accelerating bias (the high-frequency potential applied to the article 5 by the RF power supply 11). However, if the frequency is set at 10 KHz or less, the charge-up preventing effect becomes unsatisfactory, so that it is difficult to etch an insulator. Therefore, it is not preferable to set the frequency at 10 KHz or less. In this embodiment, a frequency of 800 KHz is employed taking a margin into account.

Figure 3:
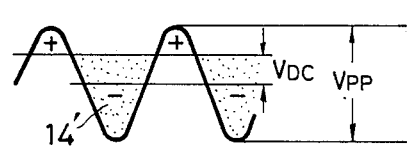

In FIG. 2, during each period of time when the applied high-frequency potential is positive, ions are not accelerated, so that ions cannot be incident on the surface of the article 5. During such period, the article 5 is not etched easily, or a polymer or the like may be deposited on the surface of the article 5 depending upon the kind of gas employed. For example, carbon atoms, hydrocarbon molecules and carbon fluoride molecules in the plasma tend to deposit when the incident energy is relatively low. Accordingly, when a high-frequency potential is being applied as shown in FIG. 2, etching and deposition are periodically repeated. This may be regarded as similar to the so-called periodical etching method (gas chopping method), and side etch is prevented by the film deposited on the side wall, thereby allowing vertical etching to be effected. The provision of the electrically fixed electrode 10 which is a ground electrode having an area which is somewhat larger than the area of the article 5 as shown in FIG. 1 allows $V_{DC}$ to increase as shown in FIG. 3 when the high-frequency potential is applied to the article 5. In this case, the area to which a fixed potential is applied should be defined by the effective area of a portion of the electrode 10 which is actually contacted by the plasma. More specifically, since the plasma distribution changes in accordance with changes in gas pressure, power, magnetic field intensity and the height of the table 6, the above-described effective area changes even in the etching apparatus having the arrangement shown in FIG. 1. For instance, when the gas pressure is relatively high (about 0.01 Torr or more) and the height of the table 6 is relatively high, the plasma tends to localize only inside the microwave inlet 1 of the etching apparatus shown in FIG. 1 and its vicinities; therefore the effective area may be defined by the area of a portion of the electrode 10 which extends along the table 6. However, in the case contrary to the above (i.e., in the case where the gas pressure is relatively low and the height of the table 6 is relatively low), the plasma tends to diffuse over a wide range; therefore, the above-described effective area may also include the inner walls of the vacuum chamber 4 and a portion of the electrode 10 which extends along the shaft of the table 6. In the case where the effective area is large as described above also, ions are accelerated during the period of time 14' when the potential of the table 6 is negative in the same manner as in the case of FIG. 2. However, in this case, the period in which ions are accelerated is longer than that in the case where $V_{DC}=0$ (shown in FIG. 2) and, at the same time, the accelerating electric field acts even stronger for the same $V_{PP}$. Accordingly, etching dominates over deposition.

From the above-described reasons, in order to accelerate the etching reaction, it is preferable to maximize the high-frequency bias $V_{PP}$ and the self-bias $V_{DC}$ within a range within which the damage to the article 5 is allowable. However, the examination made by the present inventors has found that since, in such case, the etch rate increases independently of the kind of material constituting the article 5, it is impossible to increase the ratio between the etch rates of various materials, which means that the etching selectivity is extremely degraded.

The present invention realizes microwave plasma etching which provides extremely high etching selectivity and which enables a substantially vertical side wall to be obtained, by minimizing the self-bias $V_{DC}$ formed between an article to be etched and a plasma.

More specifically, efforts have heretofore been made only at increasing the self-bias potential $V_{DC}$, together with the high-frequency bias potential $V_{PP}$, as described above, for the purpose of increasing the etch rate.

In contrast to such conventional microwave etching, the greatest feature of the present invention resides in minimization of the self-bias potential $V_{DC}$ so that the waveform of the high-frequency potential applied to an article to be etched approaches the waveform thereof in the case where $V_{DC}=0$ (shown in FIG. 2).

Thus, the etching selectivity is remarkably improved, and it is possible to selectively remove a desired region of, for example, a tungsten silicide film formed on a thin silicon dioxide film without etching the thin silicon dioxide film which constitutes an underlying layer.

In the conventional dry etching method, the etching selectivity between silicon dioxide and tungsten silicide is relatively low, and it is therefore difficult to etch a tungsten silicide film formed on a silicon dioxide film which constitutes an underlying layer while leaving the silicon dioxide film unetched. However, the present invention overcomes this problem and enables such etching to be readily carried out.

It is a matter of course that the present invention featuring the above-described point is extremely useful in formation of so-called metal-gate MOSFETs in which tungsten, molybdenum or a silicide of these elements is employed as a material for gate electrodes and wirings.

In addition, when etching is effected in such a manner that an article to be etched is subjected to a high-frequency power which has minimized $V_{DC}$ and a waveform close to the waveform shown in FIG. 2 and which employs a frequency at which ions have time sufficient to pass through the ion sheath, etching and deposition are carried out alternately as described above.

Deposition takes places not only on the upper surface (horizontal surface) of an article to be etched but also on a side wall formed by the etching However, even when the thickness of the film deposited on the horizontal surface and that on the side wall are the same, since ions in the plasma are incident on the surface of the article to be etched in a direction perpendicular to the surface, the film deposited on the horizontal surface is readily removed, and etching of the article under the deposited film progresses. Since the deposited film is not removed by radicals alone, the film deposited on the side wall is not removed completely but partially left.

As a result, the side wall covered with the above-described film is not etched, and etching progresses only in the downward direction. Thus, it is possible to effect etching which involves extremely small side etch and which provides a substantially vertical side wall.

Various methods may be employed to minimize $V_{DC}$.

For example, $V_{DC}$ can be lowered by setting the matching circuit 21 for the high-frequency power in an off-matching condition, which is contrary to that in the normal case.

Even when the matching circuit 21 is in a matching condition, it is possible to lower $V_{DC}$ by decreasing the area of the electrically fixed electrode (grounding electrode) 10 so that a voltage drop occurs between the fixed electrode 10 and the plasma.

Further, $V_{DC}$ can also be lowered by a large margin by applying a voltage to the fixed electrode 10, the voltage having an absolute value equal to that of $V_{DC}$ and an opposite sign to that of $V_{DC}$.

The matching circuit 21 is generally constituted by a combination of a capacitor C and a resistor R and adapted to enable the high-frequency power to be adjusted in accordance with an electrical load produced by the generation of a plasma. Accordingly, in many cases, this circuit is arranged such that the capacitor C and the resistor R are variable. The term "off-matching condition" means that the values of the capacitor C and the resistor R are changed to lower the input efficiency of the high-frequency power.

It should be noted that matching circuits are described in, for example, B. Chapman, "Glow-Discharge Processes", Wiley International, p. 153, 1980. These known matching circuits may be employed in the present invention. Example:

In this example, a two-layer film (WSi$_2$/Poly-Si) consisting of a tungsten silicide (WSi$_2$) film and a polycrystalline silicon film formed on an SiO$_2$ film of 20 mm thickness is etched using a photoresist as a mask.

It is also possible to apply this example to etching of electrodes, a wiring material film or various Al-alloy films in addition to the above-described two-layer film by slightly changing etching conditions, and substantially similar results can be obtained.

Figure 4:
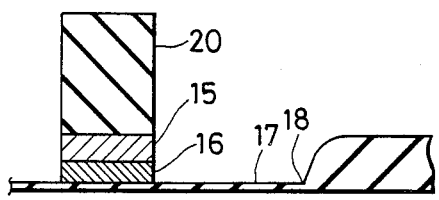
FIG. 4 is a sectional view used to describe one example of the present invention.

A mixed gas of CCl$_4$ and SF$_6$ was employed as an etching gas. The gas pressure within the vacuum chamber 4 was 10 m Torr, while the microwave power was 300 W, and the high-frequency power applied to the article 5 was 800 KHz and 30 W. Under these conditions, $V_{PP}$ was about 300 V, and $V_{DC}$ was about 10 V. The area of the table 6 was set at about 300 cm$^2$, and the effective area of the electrically fixed electrode 10 was set at 60 cm$^2$. As a result of etching carried out under these conditions, an average etch rate of the two-layer film (WSi/Poly-Si) was 500 nm/min, and the etch rate of the SiO$_2$ film as the underlying layer was 10 nm/min. Thus, it has been confirmed that the selectivity ratio of WSi/Poly-Si to SiO$_2$ is 50:1. It should be noted that the cross-sectional configuration obtained in the above-described etching is such as that shown in FIG. 4. As will be clear from FIG. 4, the slope of the side walls is substantially vertical. In FIG. 4: the reference numeral 15 denotes a WSi$_2$ film; 20, a photoresist film; 16, a Poly-Si film; and 17, an SiO$_2$ film. As shown in FIG. 4, the SiO$_2$ film 17 as an underlying layer has a step, and this structure readily causes the WSi$_2$/Poly-Si film to be partially left unetched at the lower portion 18 of the step. However, in the present invention the etching selectivity ratio between the two-layer film to be etched and the SiO$_2$ underlying film 17 is sufficiently large as described above. Therefore, even when the over-etching time is set so as to be sufficiently long, the reduction in the film thickness of the SiO$_2$ underlying film 17 is extremely small. Accordingly, although there was a step of 500 nm, it was possible to carry out excellent etching without leaving any unetched region by effecting etching with an over-etching ratio of about 70%. The thickness of the SiO$_2$ underlying film 17, which was 20 nm before etching, was reduced by 8 nm, but it was possible to obtain normal characteristics without causing gate deterioration. It should be noted that, if the application of the high-frequency bias is stopped during the over-etching, the selectivity ratio can be further increased.

When the effective area of the electrically fixed electrode 10 alone was increased to 300 cm$^2$ in the above-described example, it was found that $V_{PP}$ was unchanged, i.e., 300 V, while $V_{DC}$ increased to 150 V, and the etch rates of both the WSi$_2$/Poly-Si two-layer film and the SiO$_2$ film 17 increased, i.e., about 600 nm/min and about 60 nm/min, respectively, but the selectivity ratio decreased to about 10:1.

As will be clear from the above, as $V_{DC}$ increases, the etch rate of SiO$_2$ alone becomes relatively large; hence, the etch rate ratio of the WSi$_2$/Poly-Si two-layer film to the SiO$_2$ film 17 decreases correspondingly.

Accordingly, in order to prevent the reduction in the etch rate ratio, it is effective practice to minimize $V_{DC}$.

When W, Mo, a silicide or a polycide of these metals is etched, if $V_{DC}$ is set at 20 V, the etch rate ratio with respect to SiO$_2$ is about 30:1. Therefore, it is possible to effect extremely excellent selective etching which provides an etch rate ratio of 30:1 or more, by setting $V_{DC}$ at 20 V or less.

Even when the gas pressure within the vacuum chamber 4 differs, the etching selectivity is similarly improved by minimizing $V_{DC}$. For the same effective area of the electrically fixed electrode 10, $V_{DC}$ can be reduced by producing an off-matching condition by means of the matching circuit 21 as described above, so that the selectivity is similarly improved.

As will be clear from the above description, according to the present invention, the self-bias $V_{DC}$, which is produced between a plasma generated in the vacuum chamber and an article to be etched, is minimized by employing means for controlling $V_{DC}$. Thus, it is possible to carry out patterning of a film of a refractory metal such as tungsten, molybdenum, titanium, or a silicide or polycide of these metals, which is one of the most difficult steps in the process for manufacturing semiconductor devices, with a high degree of dimensional accuracy and high selectivity between such film and an underlying material (e.g., an SiO$_2$ film or an Si$_3$N$_4$ film).

Accordingly, a gate electrode which is made from a film of a refractory metal such as described above, or a silicide or polycide of such metals can be formed on a thin gate insulator film with a high degree of accuracy, which means that the present invention is extremely useful in formation of so-called metal-gate MOSFETs.

Further, even when there is a step on the foundation, it is possible to satisfactorily carry out over-etching which prevents a film to be etched from being partially left unetched at a step portion, which phenomenon would cause an electrical short. Thus, it is possible to effect excellent etching which enables complete removable of a film to be etched.

The present invention can realize control of etching reaction by a high-frequency bias which has heretofore been difficult to realize in reactive ion etching which is the main type of conventional dry etching. Thus, the present invention is effective in improving the production yield in manufacture of semiconductor devices and in increasing the packing density of semiconductor devices.

What is claimed is:
1. An etching apparatus comprising:
means for forming a microwave;
a vacuum chamber in which an electric discharge space is defined;
means for introducing a reaction gas into said electric discharge space of said vacuum chamber;
table means disposed within said vacuum chamber for mounting an article to be etched thereon;
means for introducing said microwave into said electric discharge space such that a plasma is generated by contact between said reaction gas and said microwave for enabling etching of said article by said plasma;
an electrically fixed electrode means, separate from said table means, for fixing a potential of said plasma at a predetermined value; and means for applying a predetermined AC bias to said article so as to control a self-bias produced between said article and said plasma.

2. An etching apparatus according to claim 1, further comprising:

means for generating a magnetic field within said electric discharge space.

3. An etching apparatus according to claim 1, wherein the effective area of said electrically fixed electrode is smaller than the area of said table.

4. An etching apparatus according to claim 1, wherein said means for applying a predetermined AC bias includes frequency control means for controlling said AC bias so as to have a frequency from 10 KHz to 10 MHz.

5. An etching apparatus according to claim 1, wherein said means for applying said predetermined AC bias includes a matching circuit connected to said table.

6. An etching apparatus according to claim 1, wherein said means for applying a predetermined AC bias includes control means for controlling said self-bias produced between said article and said plasma so as to be reduced to substantially zero such that etching selectivity of said article is increased and side-etching of said article is decreased.

7. An etching apparatus according to claim 1, wherein said means for applying a predetermined AC bias includes control means for controlling said self-bias so as to be reduced to minimum value.

8. A method of etching an article in a vacuum chamber including a table means for mounting said article within said vacuum chamber, and an electrically fixed electrode separate from said table means within said vacuum chamber, comprising the steps of:

forming a plasma of a reaction gas by exciting said reaction gas with a microwave within said vacuum chamber;

fixing a potential of said plasma to a predetermined value using said electrically fixed electrode;

exposing said article to said plasma to effect etching of predetermined regions of said article; and applying said article with an AC bias so as to control a self-bias produced between said plasma and said article.

9. An etching method according to claim 8, wherein said self-bias is controlled by setting a matching circuit for applying said AC bias to said article in an off-matching condition.

10. An etching method according to claim 8, wherein said self-bias is controlled by applying a voltage to said electrically fixed electrode, said voltage having an absolute value substantially equal to that of said self-bias and a polarity opposite to that of said self-bias.

11. An etching method according to claim 8, wherein the AC bias applied to said article has a frequency of 10 KHz to 10 MHz.

12. A method of etching an article in a vacuum chamber according to claim 8, wherein said self-bias produced between said plasma and said article is minimized to substantially zero such that etching selectivity of said article is increased and side-etching of said article is decreased.

13. A method of etching an article according to claim 8, wherein said self-bias is controlled so as to be reduced to a minimum value.

* * * * *